(12) United States Patent
Tsai et al.

(10) Patent No.: US 7,923,744 B2
(45) Date of Patent: Apr. 12, 2011

(54) SEMICONDUCTOR LIGHT-EMITTING DEVICE

(75) Inventors: Tzong-Liang Tsai, Taichung (TW); Wei-Kai Wang, Shengang Township, Taichung County (TW); Su-Hui Lin, Taichung (TW); Yi-Cun Lu, Taichung (TW)

(73) Assignee: HUGA Optotech Inc., Taichung (TW)

( * ) Notice: Subject to any disclaimer, the term of this patent is extended or adjusted under 35 U.S.C. 154(b) by 0 days.

(21) Appl. No.: 12/755,019

(22) Filed: Apr. 6, 2010

(65) Prior Publication Data

US 2010/0230706 A1 Sep. 16, 2010

Related U.S. Application Data

(63) Continuation-in-part of application No. 12/184,933, filed on Aug. 1, 2008, now Pat. No. 7,768,027.

(30) Foreign Application Priority Data

Feb. 22, 2008 (TW) .............................. 97106193 A

(51) Int. Cl.
*H01L 29/26* (2006.01)
(52) U.S. Cl. ............ 257/98; 257/99; 257/100; 257/103; 257/E23.021

(58) Field of Classification Search .................... 257/98, 257/99, 100, 103, E23.021
See application file for complete search history.

(56) References Cited

U.S. PATENT DOCUMENTS

| 7,109,529 B2 | 9/2006 | Uemura et al. |
| 2002/0024053 A1 | 2/2002 | Inoue et al. |
| 2006/0081857 A1 | 4/2006 | Hong et al. |
| 2007/0252524 A1 | 11/2007 | Lee et al. |

*Primary Examiner* — Tan N Tran
(74) *Attorney, Agent, or Firm* — Jianq Chyun IP Office

(57) ABSTRACT

The invention discloses a semiconductor light-emitting device, which includes a substrate, a first conductive type semiconductor material layer, a second conductive type semiconductor material layer, a light-emitting layer, a first electrode, a second electrode, and a plurality of bump structures. The first conductive type semiconductor material layer is formed on the substrate and has an upper surface which includes a first region and a second region distinct from the first region. The first electrode is formed on the first region. The light-emitting layer and the second conductive type semiconductor material layer are formed on the second region. The bump structures are formed on the upper surface of the first conductive type semiconductor material layer and between the first region and the second region. At least one recess is formed in the sidewall of each bump structure. Alternatively, the sidewall of each bump structure has a curved contour.

28 Claims, 10 Drawing Sheets

SEMICONDUCTOR LIGHT-EMITTING DEVICE

This is a continuation-in-part of application Ser. No. 12/184,933 filed Aug. 1, 2008, now pending.

BACKGROUND OF THE INVENTION

1. Field of the Invention

This invention relates to a semiconductor light-emitting device and, more particularly, to a semiconductor light-emitting device which has high light-extraction efficiency.

2. Description of the Prior Art

In general, semiconductor light-emitting devices (e.g., light-emitting diodes) have been widely used in many application fields, such as keyswitch systems, back light modules of cell phones, vehicle lighting systems, decorative illuminations, and remote-controlled devices. In order to ensure higher functional reliability and lower energy consumption of semiconductor light-emitting devices, the external quantum efficiency of the semiconductor light-emitting device needs to be well dominated.

In theory, the external quantum efficiency of the semiconductor light-emitting device relates to its internal quantum efficiency and its light-extraction efficiency. And, the external quantum efficiency is determined by properties and quality of material; the light-extraction efficiency refers to the radiation ratio of the radiation emitted from the internal part of the device to air or to the encapsulation material (i.e. epoxy resin). Moreover, the light-extraction efficiency is determined by the consumption that is generated while the irradiation is emitted out of the device. One of the reasons of the consumption is that the semiconductor material of the surface layer formed on the device has high refraction coefficient, which forms total reflection on the surface of the material and then makes light unable to be emitted outward. Accordingly, if the light-extraction efficiency rises, the external quantum efficiency of the semiconductor light-emitting device rises as well.

Please refer to FIG. 1. FIG. 1 is a schematic diagram illustrating a light-emitting diode 1 of prior arts. As shown in FIG. 1, the light-emitting diode 1 comprises a substrate 10, N-type GaN 12, P-type GaN 16, a light-emitting region 14 and electrodes 18. In order to electrically connect the P-type GaN 16 and the N-type GaN 12 to operate the light-emitting diode 1, one of the electrodes 18 is formed on the P-type GaN 16, and another electrode 18 is formed on the N-type GaN 12. Before forming the another electrode 18, the light-emitting diode 1 needs to partially etch the P-type GaN 16, the light-emitting region 14, and the N-type GaN 12 by etching processes. Then, another electrode 18 is formed on the exposure part of the N-type GaN 12. However, because the light-emitting region 14 is partially etched, not only the emitting area of the light-emitting diode 1 reduces, but also the light-emitting efficiency decreases, as shown in FIG. 1.

Although various kinds of light-emitting diodes are disclosed nowadays, how to increase the light-extraction efficiency of light-emitting diodes and how to enable the light-emitting diode to emit wide and uniform light are always popular. Accordingly, the scope of the invention is to provide a semiconductor light-emitting device to solve the above-mentioned problems.

SUMMARY OF THE INVENTION

A scope of the invention is to provide a semiconductor light-emitting device. The semiconductor light-emitting device has high light-extraction efficiency and is capable of emitting a wide and uniform light.

According to an embodiment of the invention, the semiconductor light-emitting device includes a substrate, a first conductive type semiconductor material layer, a second conductive type semiconductor material layer, a light-emitting layer, a first electrode, a second electrode, and a plurality of bump structures.

The first conductive type semiconductor material layer is formed on the substrate. The first conductive type semiconductor material layer has an upper surface, and the upper surface includes a first region and a second region which is distinct from the first region. The first electrode is formed on the first region, and the light-emitting layer is formed on the second region. The second conductive type semiconductor material layer is formed on the light-emitting layer. The second electrode is formed on the second conductive type semiconductor material layer. The plurality of bump structures are formed on the upper surface of the first conductive type semiconductor material layer and between the first region and the second region Furthermore, at least one recess is formed in the sidewall of each bump structure. According to another embodiment of the invention, the sidewall of each bump structure substantially has a curved contour.

The advantage and spirit of the invention may be understood by the following recitations together with the appended drawings.

BRIEF DESCRIPTION OF THE APPENDED DRAWINGS

Figure 3:
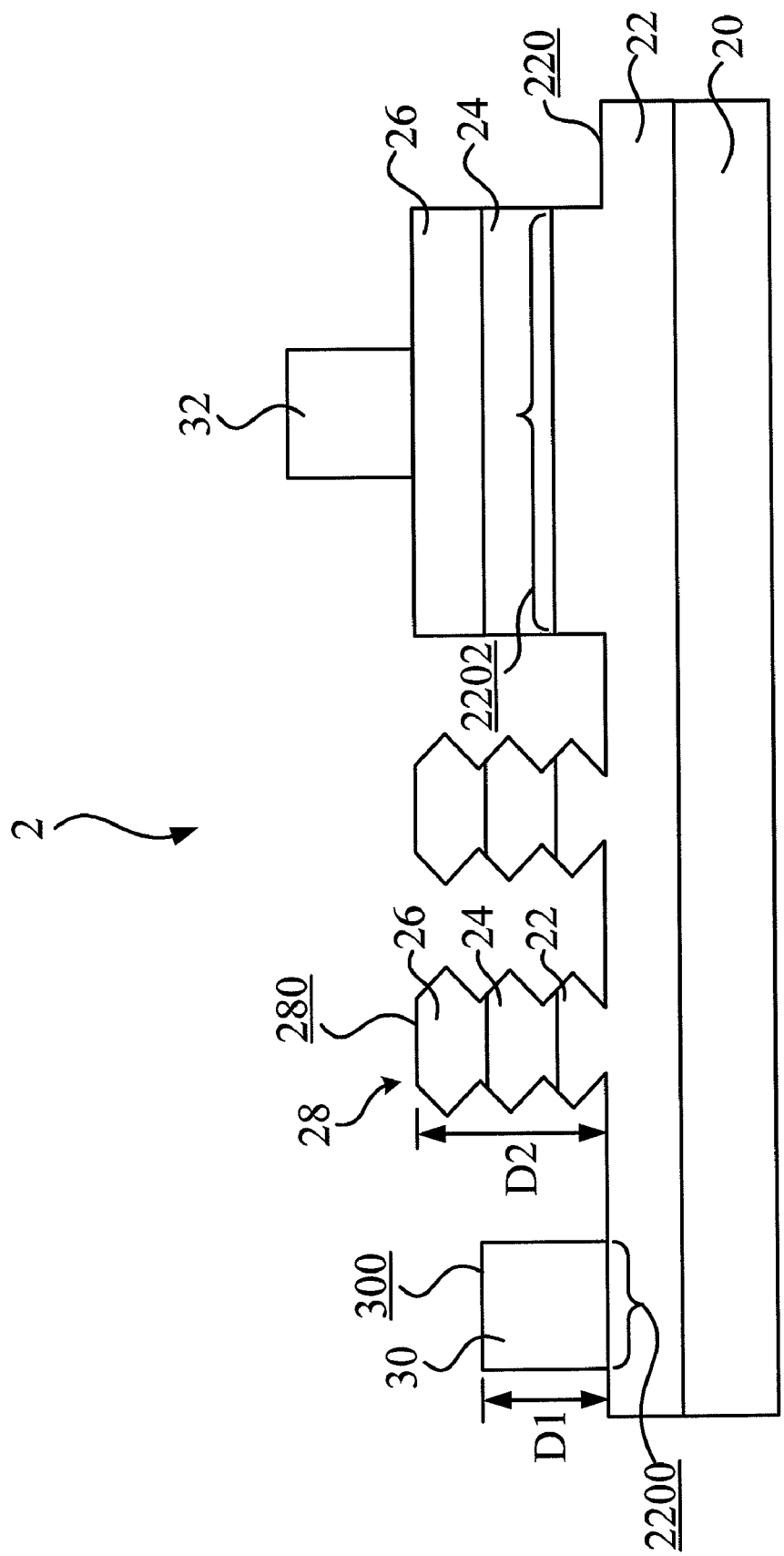
Figure 4A:
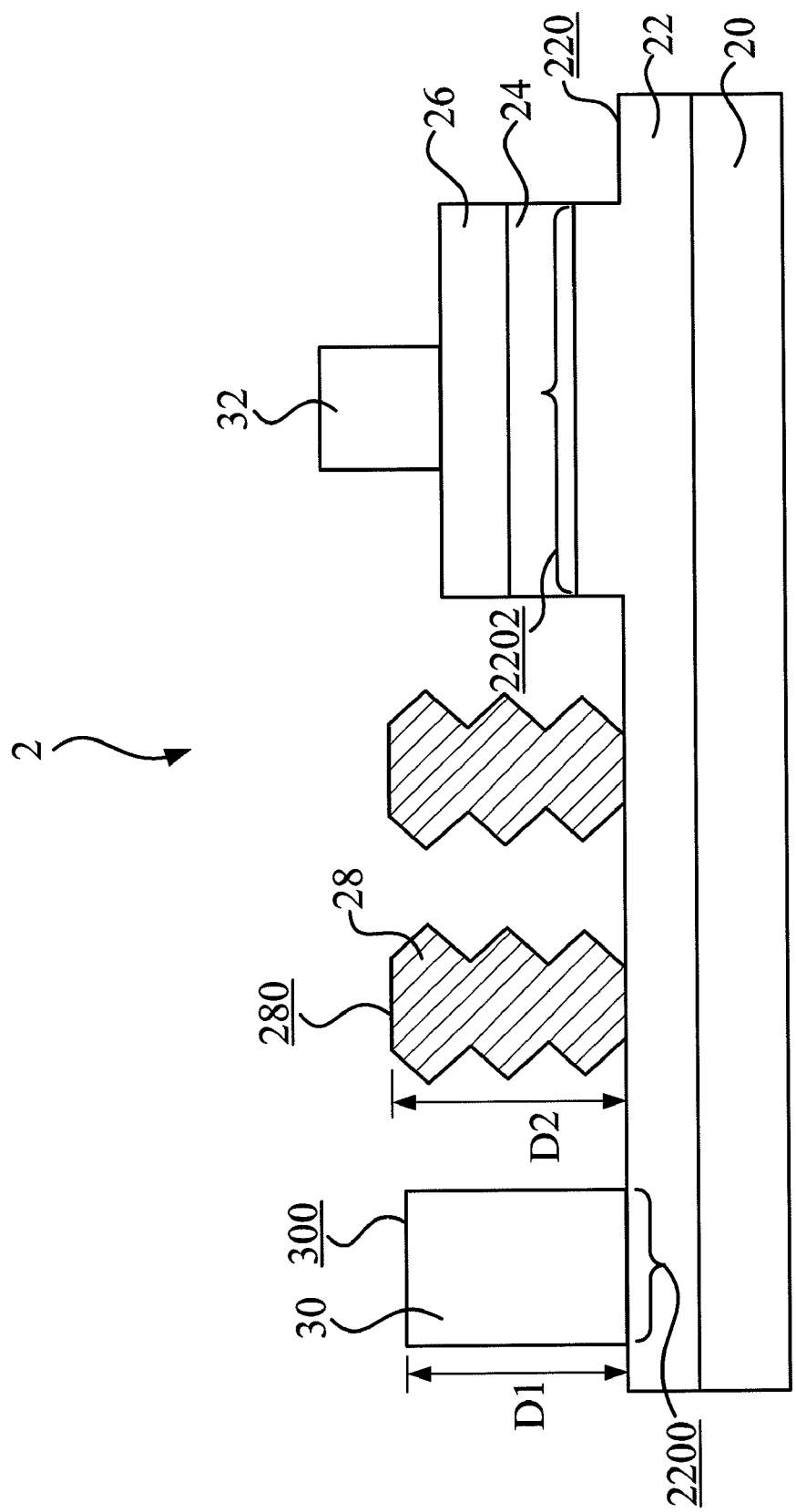
Figure 4B:
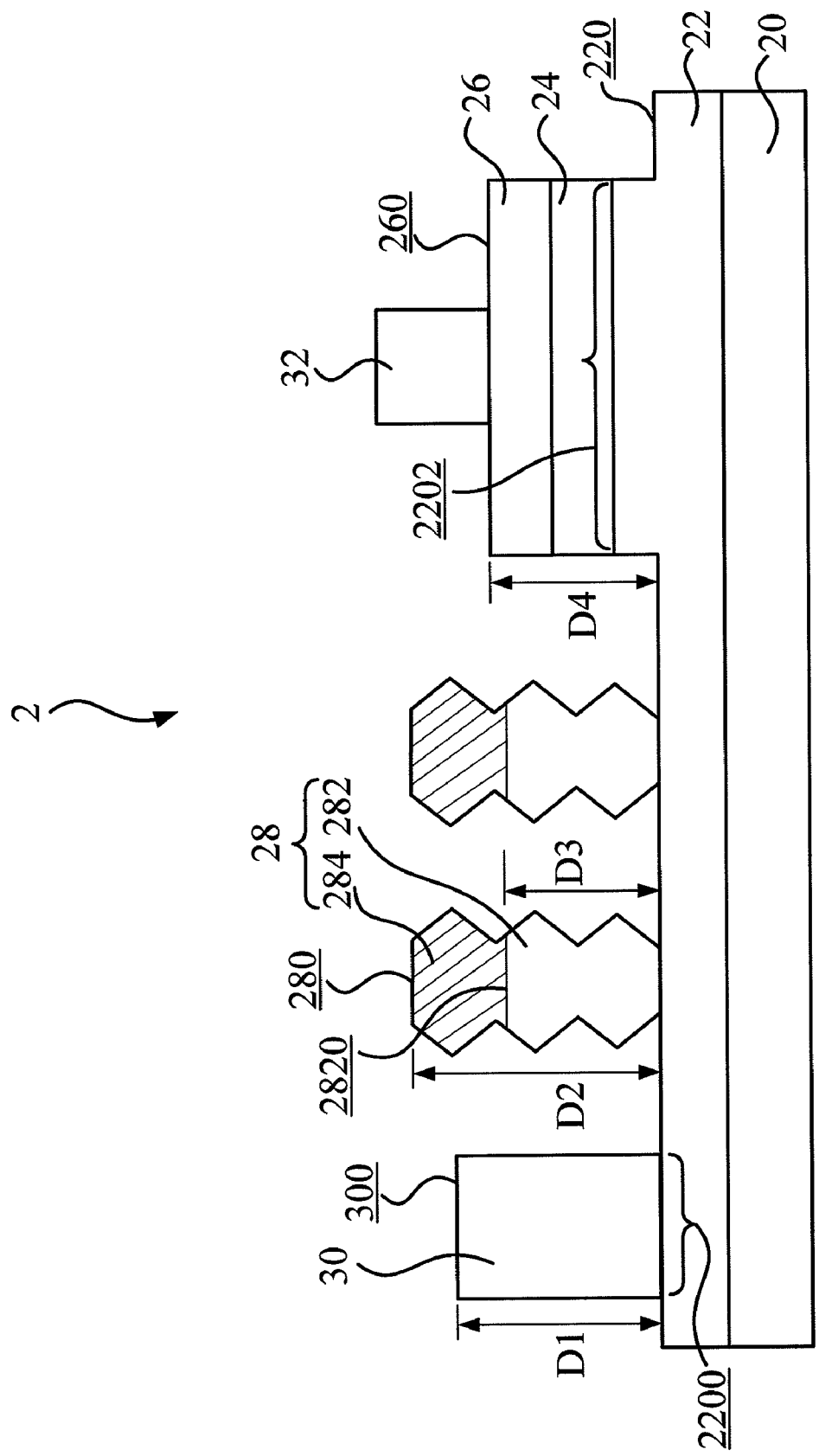

FIG. 3, FIG. 4A, and FIG. 4B are schematic diagrams illustrating the composing of each bump structures according to the invention.

Figure 5:
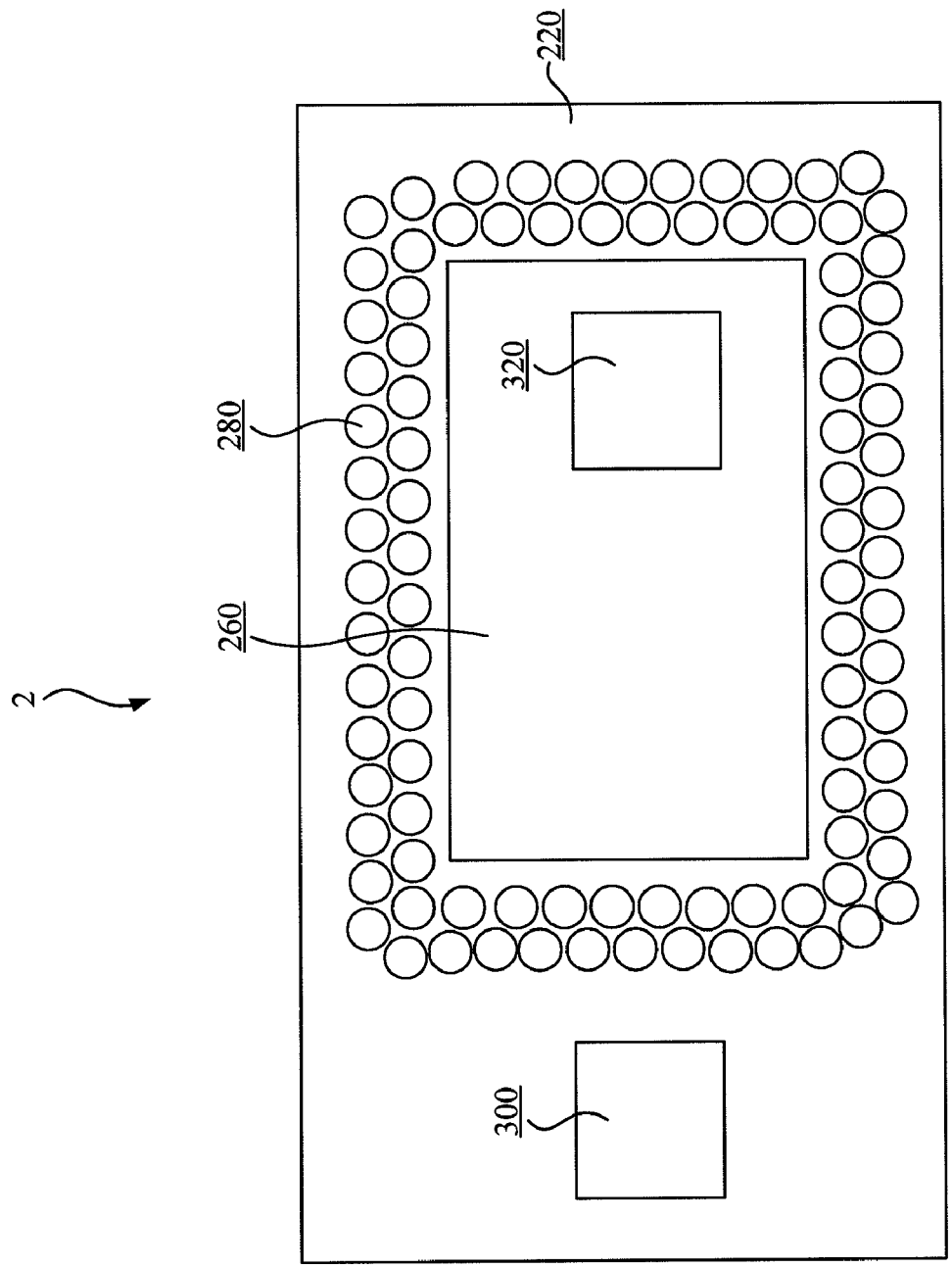

FIG. 5 is a top view illustrating the semiconductor light-emitting device according to the invention.

Figure 1:
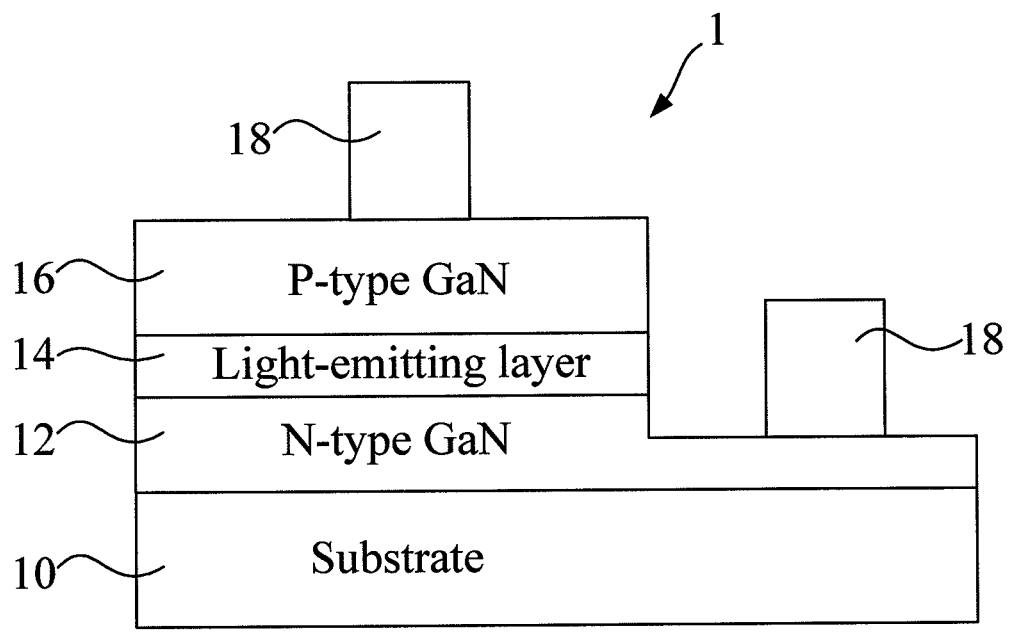
FIG. 1 is a schematic diagram illustrating a light-emitting diode of prior arts.
Figure 2A:
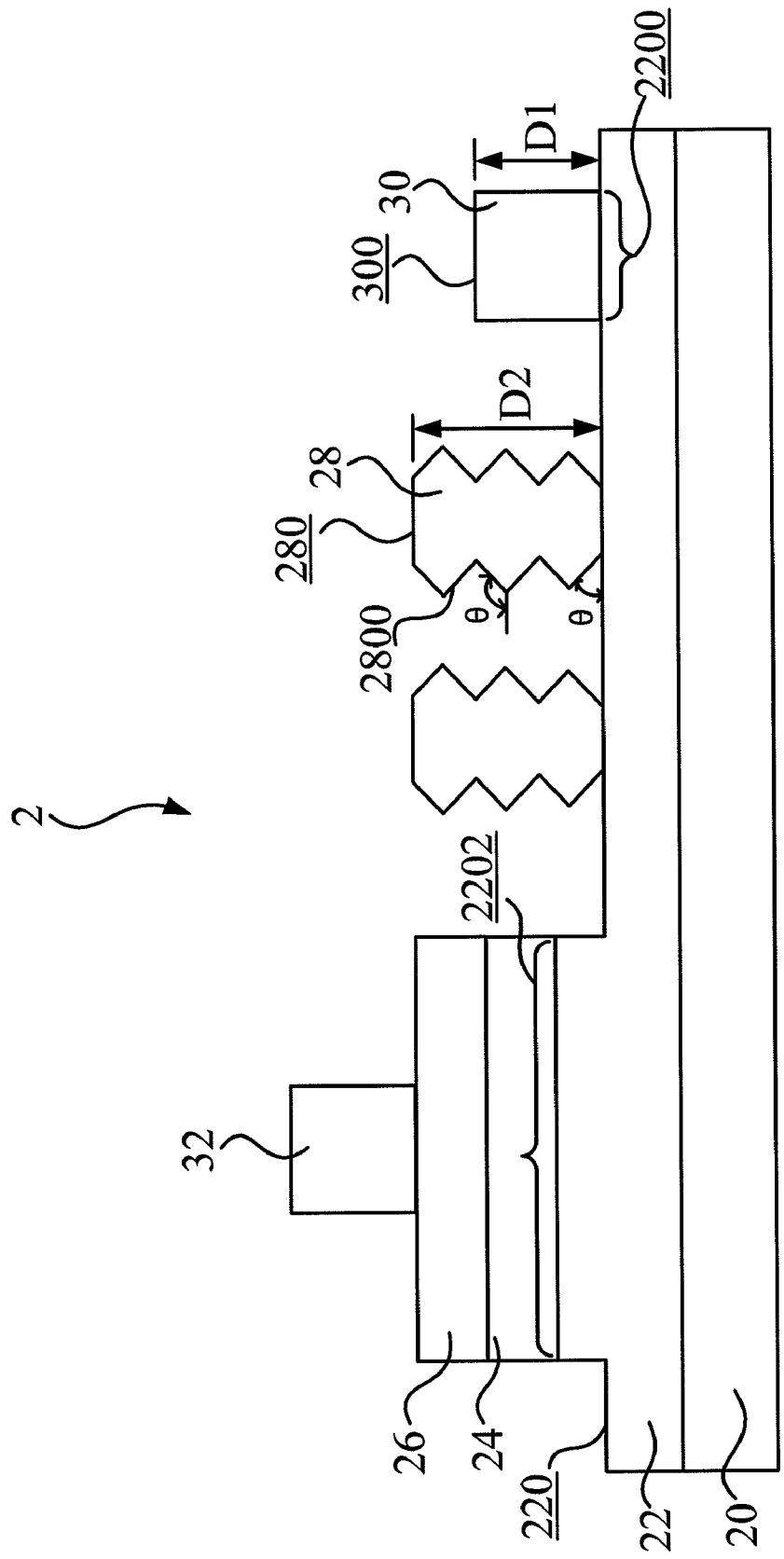
FIG. 2A is a cross-sectional view illustrating a semiconductor light-emitting device according to an embodiment of the invention.
Figure 6A:
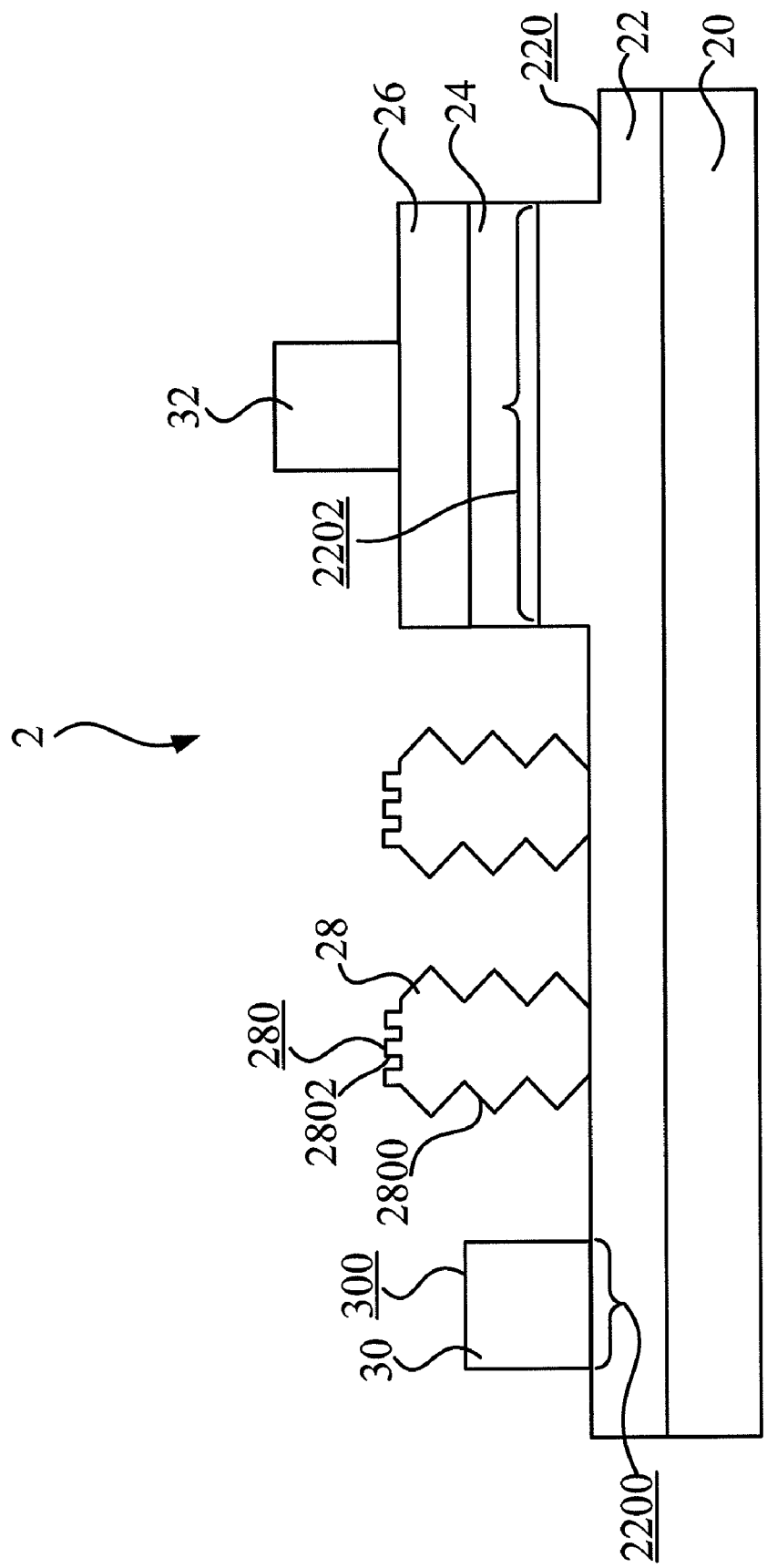

FIG. 6A is a cross-sectional view illustrating at least one recess which is further formed on the top surface of the bump structure in FIG. 2A.

Figure 2B:
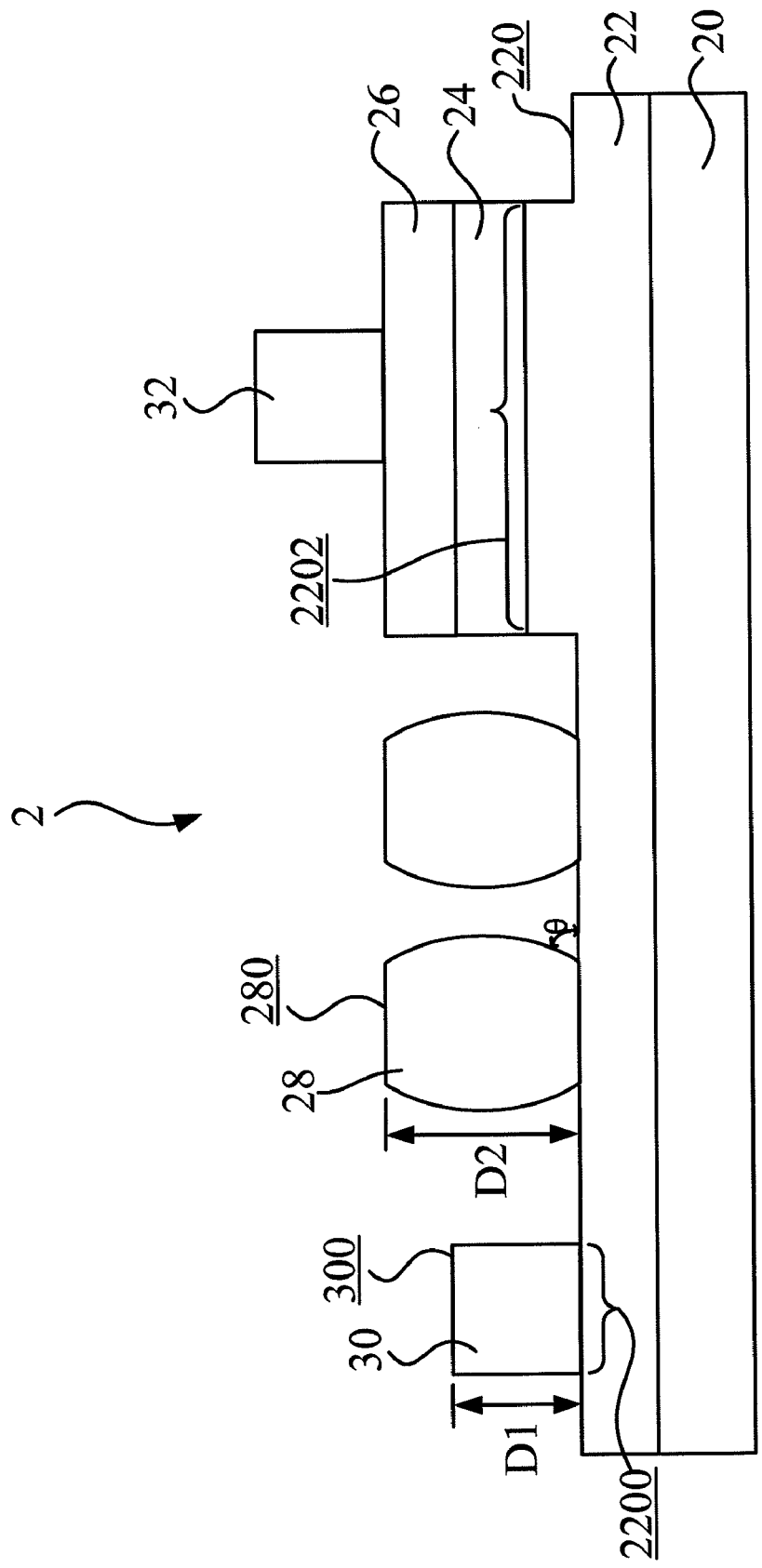
FIG. 2B is a cross-sectional view illustrating another semiconductor light-emitting device according to an embodiment of the invention.
Figure 6B:
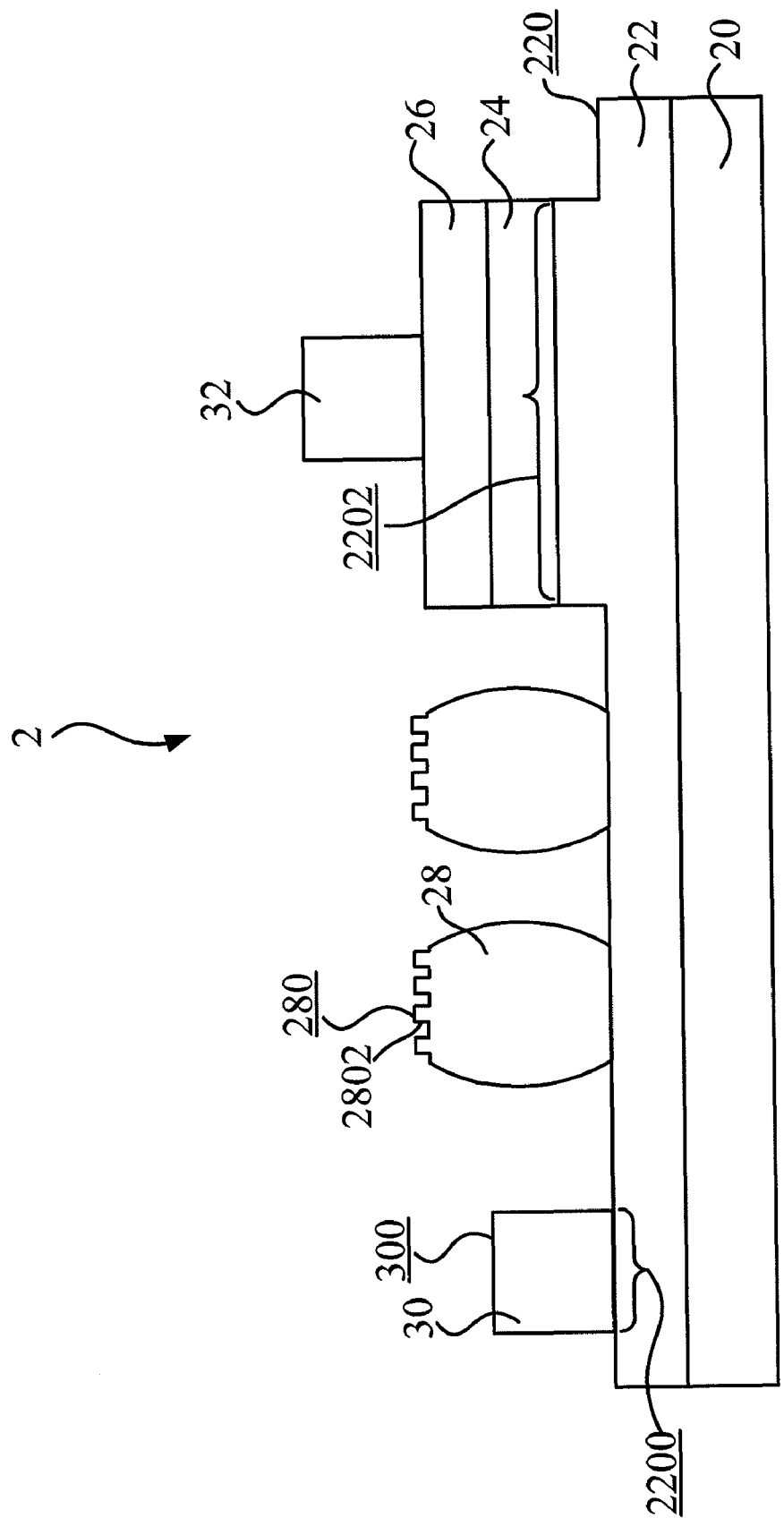

FIG. 6B is a cross-sectional view illustrating at least one recess which is further formed on the top surface of the bump structure in FIG. 2B.

Figure 7:
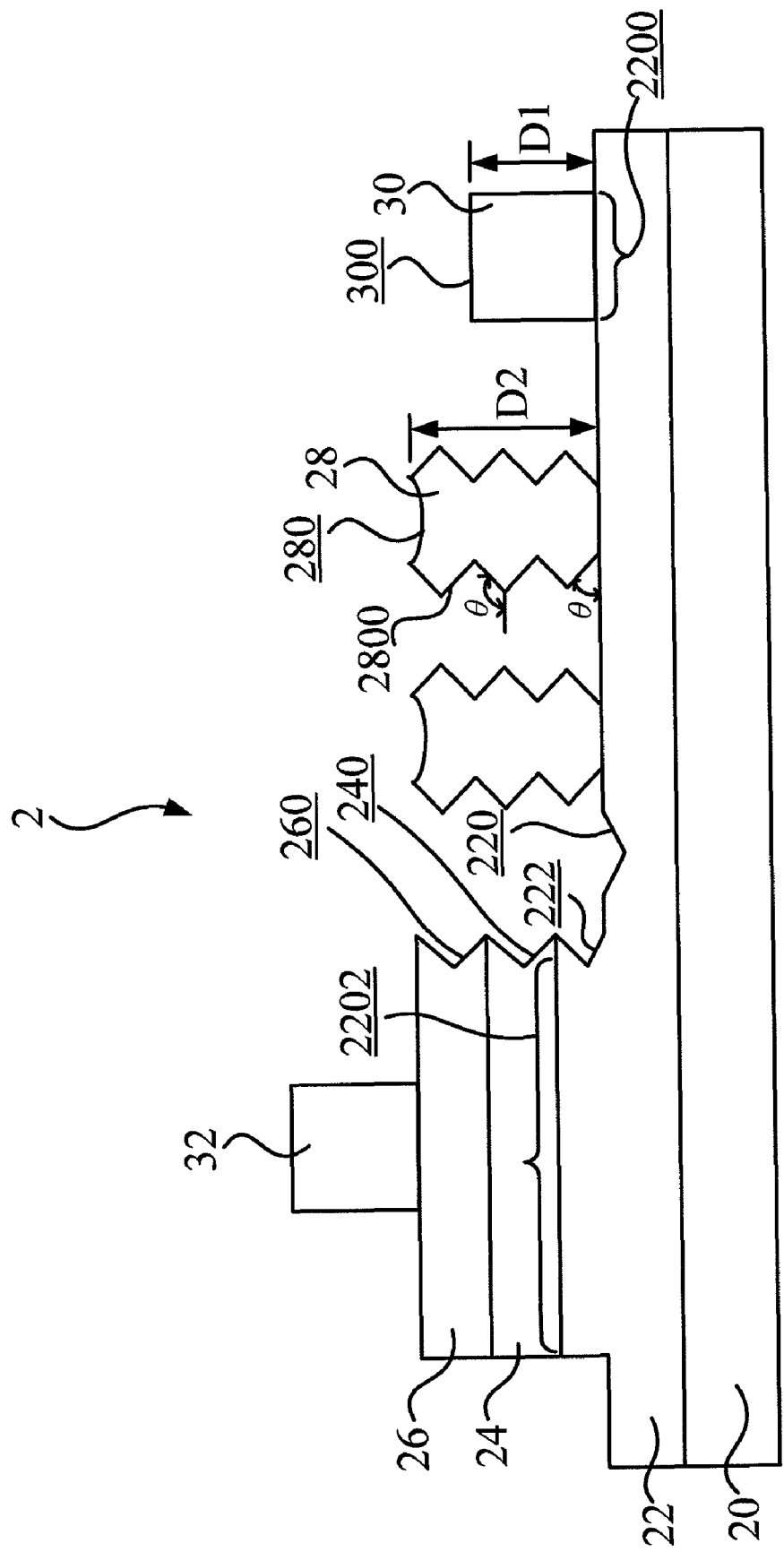

FIG. 7 is a cross-sectional view illustrating another embodiment of the semiconductor light-emitting device 2.

DETAILED DESCRIPTION OF THE INVENTION

Please refer to FIG. 2A. FIG. 2A is a cross-sectional view illustrating a semiconductor light-emitting device 2 according to an embodiment of the invention.

As shown in FIG. 2A, the semiconductor light-emitting device 2 includes a substrate 20, a first conductive type semiconductor material layer 22, a light-emitting layer 24, a second conductive type semiconductor material layer 26, a first electrode 30, a second electrode 32, and a plurality of bump structures 28.

In a practical application, the substrate 20 can be, but not limited to, glass, silicon, Ge, GaN, GaAs, GaP, AlN, sapphire, spinnel, $Al_2O_3$, SiC, ZnO, MgO, $LiAlO_2$, $LiGaO_2$ and $MgAlO_4$.

According to an embodiment, the first conductive type semiconductor material layer 22 and the second conductive type semiconductor material layer 26 are made of Group III-V compound semiconductor material.

The Group III element of the Group III-V compound semiconductor material can be Al, Ga, or In. The Group V element of the Group III-V compound semiconductor material can be N, P, or As. In the embodiment, the first conductive type semiconductor material layer 22 and second conductive type semiconductor material layer 26 can be made of GaN.

The first conductive type semiconductor material layer 22 is formed on the substrate 20, and the first conductive type can be N type. In other words, the first conductive type semiconductor material layer 22 is a N type GaN contact layer. The first conductive type semiconductor material layer 22 has an upper surface 220, and the upper surface 220 includes a first region 2200 and a second region 2202 which is distinct from the first region 2200. The first electrode 30 is formed on the first region 2200, and the light-emitting layer 24 is formed on the second region 2202. The first electrode 30 is a N type electrode.

The second conductive type semiconductor material layer 26 is formed on the light-emitting layer 24. The second conductive semiconductor material layer 26 which corresponds to the first conductive semiconductor material layer 22 is a P type GaN contact layer. The second electrode 32 can be formed on the second conductive type semiconductor material layer 26, and the second electrode is a P type electrode.

As shown in FIG. 2A, the plurality of bump structures 28 are formed on the upper surface 220 of the first conductive type semiconductor material layer 22 and between the first region 2200 and the second region 2202. In a practical application, each bump structure 28 can be in a form of a column, an ellipse, or a polygon, etc., according to the top view. Additionally, the upper surface 280 of each bump structure 28 can have a curved contour, but not limited by this case.

Particularly, at least one recess 2800 is formed in the sidewall of each bump structure 28. In the embodiment, the sidewall of each bump structure 28 is incised, so that the sidewall forms a plurality of recess 2800. That is to say, the sidewall of each bump structure 28 has a roughened surface morphology. Please refer to FIG. 2B. FIG. 2B is a cross-sectional view illustrating another semiconductor light-emitting device 2 according to one embodiment of the invention. In another embodiment, the sidewall of each bump structure 28 substantially has a curved contour.

Assume that the sidewall of each bump structure 28 has a straight contour, and the included angle between the sidewall and the upper surface 220 of the first conductive type semiconductor material layer 22 equals to 90 degrees, the light which is emitted from the light-emitting layer 24 will be constrained to be reflected between the bump structure 28 and the main body of the semiconductor light-emitting device 2. However, because each sidewall of the bump structure 28 has a roughened surface morphology or a curved contour, the included angle between a part of the sidewall and the upper surface 220 of the first conductive type semiconductor material layer 22 may be larger than or smaller than 90 degrees, as shown in FIG. 2A and FIG. 2B. Thus, the light which is emitted from the light-emitting layer 24, especially the side light, can be reflected to change the direction by the sidewall of the bump structure 28 after being emitted to the bump structure 28. And, the probability of emitting the light out of the observation side of the semiconductor light-emitting device 2 thus increases.

In addition, assume that the observation side of the semiconductor light-emitting device 2 is upward, the light which is emitted from the light-emitting layer toward the bottom of the semiconductor light-emitting device 2 will be guided to emit out the observation side by the plurality of bump structures 28 when the light is reflected to be emitted toward the plurality of bump structures 28. Besides, if the plurality of bump structures 28 is distributed uniformly on the upper surface 220 of the first conductive semiconductor material layer 22, the semiconductor light-emitting device 2 can produces the light that is wider and more uniform.

In order to prevent the light which is emitted from the light-emitting layer 24 from being absorbed by the first electrode 30, the height of each bump structure 28 can be substantially equal to or higher than that of the first electrode 30. As shown in FIG. 2A, if the upper surface 220 of the first conductive type semiconductor material layer 22 is regarded as a reference plane, the height of the top surface 300 of each first electrode 30 is D1, the height of the top surface 280 of each bump surface 28 is D2, and D2 can be substantially equal to or larger than D1 to prevent the light from emitting to the first electrode 30.

Please refer to the FIG. 3. FIG. 3 is a schematic diagram illustrating the composing of each bump structures 28 according to the invention. FIG. 3 illustrates an example which represents that each bump structure 28 can be composed of the first conductive type semiconductor material layer 22, the second conductive type semiconductor material layer 26, and light-emitting layer 24. Or, each bump structure 28 can be totally composed of the first conductive type semiconductor material layer 22. It is notable that in order to prevent the light which is emitted by the main body of the semiconductor light-emitting device 2 from being absorbed, the light-emitting layer 24 of each bump structure 28 in FIG. 3 can be removed.

In another embodiment, each bump structure 28 can be made of a specific material whose refraction index is larger than 1 to have a better light-extraction efficiency, as shown in FIG. 4A. The specific material can be, but not limited to, ITO, $SiO_2$, SiN, ZnO, polymide, BCB, SOG, InO, SnO, a Group III-V compound semiconductor material, or a Group II-VI compound semiconductor material. The group III element and the group V element of the Group III-V compound semiconductor material are the same as the above-mentioned description. The group II element of the Group II-VI compound semiconductor material can be Be, Mg, Ga, or Sr, and the group II element of the Group II-VI compound semiconductor material can be O, S, Se, or Te.

Owing to the difference between the refraction index of air and that of the specific material, the light-extraction efficiency of the semiconductor light-emitting device 2 can be effectively prompted. Because the refraction index of the specific material is larger than 1 (e.g., the refraction index of air is 1), the side light emitted by the semiconductor light-emitting device 2 can be refracted upward or downward via the specific material and prevent from being absorbed by the first electrode 30 to increase the light-extraction efficiency of the semiconductor light-emitting device 2.

In another embodiment, each bump structure 28 can also be made of insulating materials. Or, in another embodiment, each bump structure 28 can include a first structure layer 282 and a second structure layer 284, as shown in FIG. 4B. As the bump structure 28 shown in FIG. 3, the first structure layer 282 can be composed of the first conductive type semiconductor material layer 22, the second conductive type semiconductor material layer 26, and the light-emitting layer 24. Or, the first structure layer 282 can be totally composed of the first conductive type semiconductor material layer 22. The second structure layer 284 is formed on the first structure 282 and is made of the specific material whose refraction index is larger than 1. And, the specific material is the same as the above-mentioned description.

In order to increase the light-extraction efficiency, in one preferred embodiment, it is assumed that the upper surface 220 of the first conductive type semiconductor material layer 22 is regarded as a reference plane, then the height of the top surface 300 of first electrode 30 is D1, the height of the top surface 280 of each bump structure 28 is D2, and D2 is substantially equal to or larger than D1 to prevent the light which is emitted by the light-emitting layer 24 from being absorbed by the first electrode 30; moreover, the height of the top surface 2820 of the first structure layer 282 is D3, and the height of the top surface 260 of the second conductive type semiconductor material layer 26 is D4, wherein, D4 is substantially equal to or larger than D3.

Please refer to FIG. 5. FIG. 5 is a top view illustrating the semiconductor light-emitting device 2 according to the invention. In a practical application, the plurality of bump structures 28 need to be surrounded by the light-emitting layer 24 (not shown in FIG. 5) to guide the light emitted from the light-emitting layer 24 toward the observation side of the semiconductor light-emitting device 2. In a preferred embodiment, as the FIG. 5 shown, the plurality of bump structures 28 can be arranged to be two substantially concentric circular patterns, and the circular patterns are staggered to ensure that the plurality of bump structures 28 guide the light emitted from the light-emitting layer 24 toward the observation side of the semiconductor light-emitting device 2. Furthermore, the plurality of bump structures 28 also can be fully disposed on the upper surface 220 of the first conductive type semiconductor material layer 22 to ensure that the light-extraction efficiency of the semiconductor light-emitting device 2 can be increased.

Please refer to the FIG. 6A and FIG. 6B. In FIG. 6A is a FIG. 2A illustrating that a upper surface 280 of the bump structure 28 further comprising at least one curve 2802 section diagram. In FIG. 6B, the top surface 280 of the bump structure 28 further forms at least one curve 2802 section diagram. In other words, the top surface 280 of the bump structure 28 has a roughened surface morphology without the sidewall, or the top surface 280 of the bump structure 28 has a curved contour. Whatever the top surface 280 of the bump structure is roughened surface morphology or curved contour, it can increase the light-extraction efficiency.

Please refer to FIG. 7. FIG. 7 is a cross-sectional view illustrating another embodiment of the semiconductor light-emitting device 2. As shown in FIG. 7, the sidewall 240 of the light-emitting layer 24, the sidewall 260 of the second conductive type semiconductor material layer 26, the sidewall 222 and the upper surface 220 of the first conductive type semiconductor material layer 22, the top surface 280 of each bump structure 28 are all roughened to further increase the light-extraction efficiency of the semiconductor light-emitting device 2.

Compared with prior arts, the semiconductor light-emitting device according to the invention can guide the light emitted from the semiconductor light-emitting device toward the observation side by the plurality of bump structures, so as to increase the light-extraction efficiency of the semiconductor light-emitting device and generate the light that is wider and more uniform. Particularly, the bump structure according to the invention has a roughened surface morphology or a curved contour, thus the light-extraction efficiency can be prompted. Additionally, owing to high light-extraction efficiency, the semiconductor light-emitting device of the invention can be applied to photo-pump.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light-emitting device, comprising:
    a substrate;
    a first conductive type semiconductor material layer, the first conductive type semiconductor material layer being formed on the substrate and having an upper surface, and the upper surface comprising a first region and a second region distinct form the first region;
    a first electrode being formed on the first region;
    a light-emitting layer, the second region being formed on the light-emitting layer;
    a second conductive type semiconductor material layer being formed on the light-emitting layer;
    a second electrode being formed on the second conductive type semiconductor material layer; and
    a plurality of bump structures being formed on the upper surface of the first conductive type semiconductor material layer and between the first region and the second region, wherein at least one recess is formed in the sidewall of each bump structure.

2. The semiconductor light-emitting device of claim 1, wherein an included angle between a part of the sidewall of each bump structure and the upper surface of the first conductive type semiconductor material layer is larger than or smaller than 90 degrees.

3. The semiconductor light-emitting device of claim 1, wherein the height of a first upper surface of the first electrode is substantially equal to or smaller than that of a second upper surface of each bump structure.

4. The semiconductor light-emitting device of claim 3, wherein each bump structure is made of a material whose the refractive index is larger than 1, and the material is one selected from the group consisting of ITO, SiO2, SiN, ZnO, polymide, BCB, SOG, InO, SnO, a Group III-V compound semiconductor material, and a Group II-VI compound semiconductor material.

5. The semiconductor light-emitting device of claim 1, wherein each bump structure comprises:
    a first structure layer; and
    a second structure layer, formed on the first structure layer and made of a material whose the refractive index is larger than 1, and the material is one selected from the group consisting of ITO, SiO2, SiN, ZnO, polymide, BCB, SOG, InO, SnO, a Group III-V compound semiconductor material and a Group II-VI compound semiconductor material.

6. The semiconductor light-emitting device of claim 5, wherein the height of a first upper surface of the first electrode is substantially equal to or smaller than that of a second upper surface of each bump structure.

7. The semiconductor light-emitting device of claim 6, wherein the height of a third upper surface of the first structure layer is substantially equal to or smaller than that of a fourth upper surface of second conductive type semiconductor material layer.

8. The semiconductor light-emitting device of claim 1, wherein each bump structure is made of insulating material.

9. The semiconductor light-emitting device of claim 1, wherein at least one recess is further formed on the upper surface of each bump structure.

10. The semiconductor light-emitting device of claim 1, wherein the upper surface of each bump structure has a curved contour.

11. The semiconductor light-emitting device of claim 1, wherein the first conductive type is N type, and the second conductive type is P type.

12. The semiconductor light-emitting device of claim 1, wherein the substrate is one selected from the group consisting of glass, silicon, GaN, GaAs, GaP, AlN, sapphire, spinnel, Al2O3, SiC, ZnO, MgO, LiALO2, LiGaO2 and MgAlO4.

13. The semiconductor light emitting device of claim 1, wherein the sidewall of the light-emitting layer, the sidewall of the second conductive type semiconductor material layer, the sidewall and the upper surface of the first conductive type semiconductor material layer, the top surface of each bump structure are roughened.

14. The semiconductor light emitting device of claim 1, wherein each bump structure is composed of the first conductive type semiconductor material layer, the second conductive type semiconductor material layer, and light-emitting layer.

15. A semiconductor light-emitting device, comprising:
a substrate;
a first conductive type material semiconductor layer, the first conductive type semiconductor material layer being formed on the substrate and having an upper surface, and the upper surface comprising a first region and a second region distinct from the first region;
a first electrode being formed on the first region;
a light-emitting layer, the second region being formed on the light-emitting layer;
a second conductive type semiconductor material layer being formed on the light-emitting layer;
a second electrode being formed on the second conductive type semiconductor material layer; and
a plurality of bump structures being foamed on the upper surface of the first conductive type semiconductor material layer and between the first region and second region, wherein the sidewall of each bump structure substantially has a curved contour.

16. The semiconductor light-emitting device of claim 15, wherein an included angle between a part of the sidewall of each bump structure and the upper surface of the first conductive type semiconductor material layer is larger than or smaller than 90 degrees.

17. The semiconductor light-emitting device of claim 15, wherein the height of a first upper surface of the first electrode is substantially equal to or smaller than that of a second upper surface of each bump structure.

18. The semiconductor light-emitting device of claim 17, wherein each bump structure is made of a material whose the refractive index is larger than 1 of a bump structures and the material is formed by one selected from the group consisting of ITO, SiO2, SiN, ZnO, polymide, BCB, SOG, InO, SnO, a Group III-V compound semiconductor material, and a material Group II-VI compound semiconductor material.

19. The semiconductor light-emitting device of claim 15, wherein each bump structures comprising:
a first structure layer; and
a second structure layer, formed on the first structure layer and made of a material whose the refractive index is larger than 1, and the material is one selected from the group consisting of ITO, SiO2, SiN, ZnO, polymide, BCB, SOG, InO, SnO, a Group III-V compound semiconductor material and a Group II-VI compound semiconductor material.

20. The semiconductor light-emitting device of claim 19, wherein the height of a first upper surface of the first electrode is substantially equal to or smaller than that of a second upper surface of each bump structure.

21. The semiconductor light-emitting device of claim 20, wherein the height of a third upper surface of the first structure layer is substantially equal to or smaller than that of a fourth upper surface of the second conductive type semiconductor material layer.

22. The semiconductor light-emitting device of claim 15, wherein each bump structure is made of insulating material.

23. The semiconductor light-emitting device of claim 15, wherein at least one recess is further formed on the upper surface of bump structures.

24. The semiconductor light-emitting device of claim 15, wherein the upper surface of each bump structure has a curved contour.

25. The semiconductor light-emitting device of claim 15, wherein the first conductive type is N type, and the second conductive type is P type.

26. The semiconductor light-emitting device of claim 15, wherein the substrate is one selected from the group consisting of glass, silicon, GaN, GaAs, GaPb, AlN, sapphire, spinel, Al2O3, SiC, ZnO, MgO, AlLiO2, GaLiO2 and AlMgO4.

27. The semiconductor light emitting device of claim 15, wherein the sidewall of the light-emitting layer, the sidewall of the second conductive type semiconductor material layer, the sidewall and the upper surface of the first conductive type semiconductor material layer, the top surface of each bump structure are roughened.

28. The semiconductor light emitting device of claim 15, wherein each bump structure is composed of the first conductive type semiconductor material layer, the second conductive type semiconductor material layer, and light-emitting layer.

* * * * *